United States Patent [19]

Greer et al.

[11] Patent Number: 5,697,082
[45] Date of Patent: Dec. 9, 1997

[54] SELF-CALIBRATING FREQUENCY STANDARD SYSTEM

[76] Inventors: Steven Craig Greer, 3201 Toler Rd., Rowlett, Tex. 75088; Hussein S. El-Ghoroury, 7275 Spoonbill La., Carlsbad, Calif. 92024-9009

[21] Appl. No.: 525,111

[22] Filed: Sep. 8, 1995

Related U.S. Application Data

[63] Continuation-in-part of Ser. No. 130,278, Oct. 1, 1993, abandoned.

[51] Int. Cl.$^6$ .................. H04L 7/00; H04B 7/19
[52] U.S. Cl. ................. 455/255; 375/358; 331/44
[58] Field of Search ................. 375/358, 359, 375/357; 455/13.2, 51.1, 255, 256, 257, 258, 259; 331/44, 47; 368/47, 184

[56] References Cited

U.S. PATENT DOCUMENTS

| | | | |
|---|---|---|---|
| 4,005,266 | 1/1977 | Lehr et al. | 178/69.1 |
| 4,466,130 | 8/1984 | Sewerinson | 455/260 |
| 4,602,375 | 7/1986 | Inukai | 375/109 |
| 4,607,257 | 8/1986 | Noguchi | 340/825.69 |
| 4,792,963 | 12/1988 | Campanella et al. | 375/109 |
| 4,800,560 | 1/1989 | Aoki et al. | 370/104 |
| 4,899,117 | 2/1990 | Vig | 331/3 |
| 4,901,368 | 2/1990 | Arnold et al. | 455/12 |
| 4,932,070 | 6/1990 | Waters et al. | 455/10 |
| 5,019,824 | 5/1991 | Kumar | 342/195 |
| 5,144,595 | 9/1992 | Graham et al. | 367/135 |
| 5,155,695 | 10/1992 | Stein | 364/569 |
| 5,202,829 | 4/1993 | Geier | 364/449 |
| 5,506,781 | 4/1996 | Cummiskey et al. | 364/459 |

OTHER PUBLICATIONS

Brown, Robert Grover; Hwang, Patrick Y.C., *Introduction to Random Signals and Applied Kalman Filtering*, John Wiley & Sons, Inc., 1992, pp. 210–241.

"Kalman Filter Analysis of Precision Clocks with Real-Time Parameter Estimation", S. R. Stein, *43rd Annual Symposium IEEE*, 1989, pp. 232–236.

"Kalman Filter Analysis for Real Time Applications of Clocks and Oscillators", S. R. Stein, R. L. Filler, *42nd Annual Frequency Control Symposium*—1988, pp. 447–452.

"The Application of Kalman Filters and ARIMA Models To the Study of Time Prediction Errors of Clocks for Use in the Defense Communication System (DCS)", S. R. Stein, John Evans, *Fourty–Fourth Annual Symposium on Frequency Control*, 1990, pp. 630–635.

*Primary Examiner*—Wellington Chin
*Assistant Examiner*—Jean B. Corrielus
*Attorney, Agent, or Firm*—Kyle Eppele; M. Lee Murrah

[57] ABSTRACT

A system for self-calibrating a clock of a communication terminal for use with communication systems in which a central communication node generates time base correction signals for the terminal clock includes a terminal oscillator which generates an oscillator frequency that includes an error amount. An oscillator calibration filter generates a frequency error estimate amount. Circuitry is provided for subtracting the frequency error estimate amount generated by the calibration filter from the oscillator frequency error amount. Circuitry is provided for applying the time base correction signals to the calibration filter to thereby modify the frequency error estimate amount generated by the calibration filter based upon the time base correction signals generated by the communication central node.

5 Claims, 1 Drawing Sheet

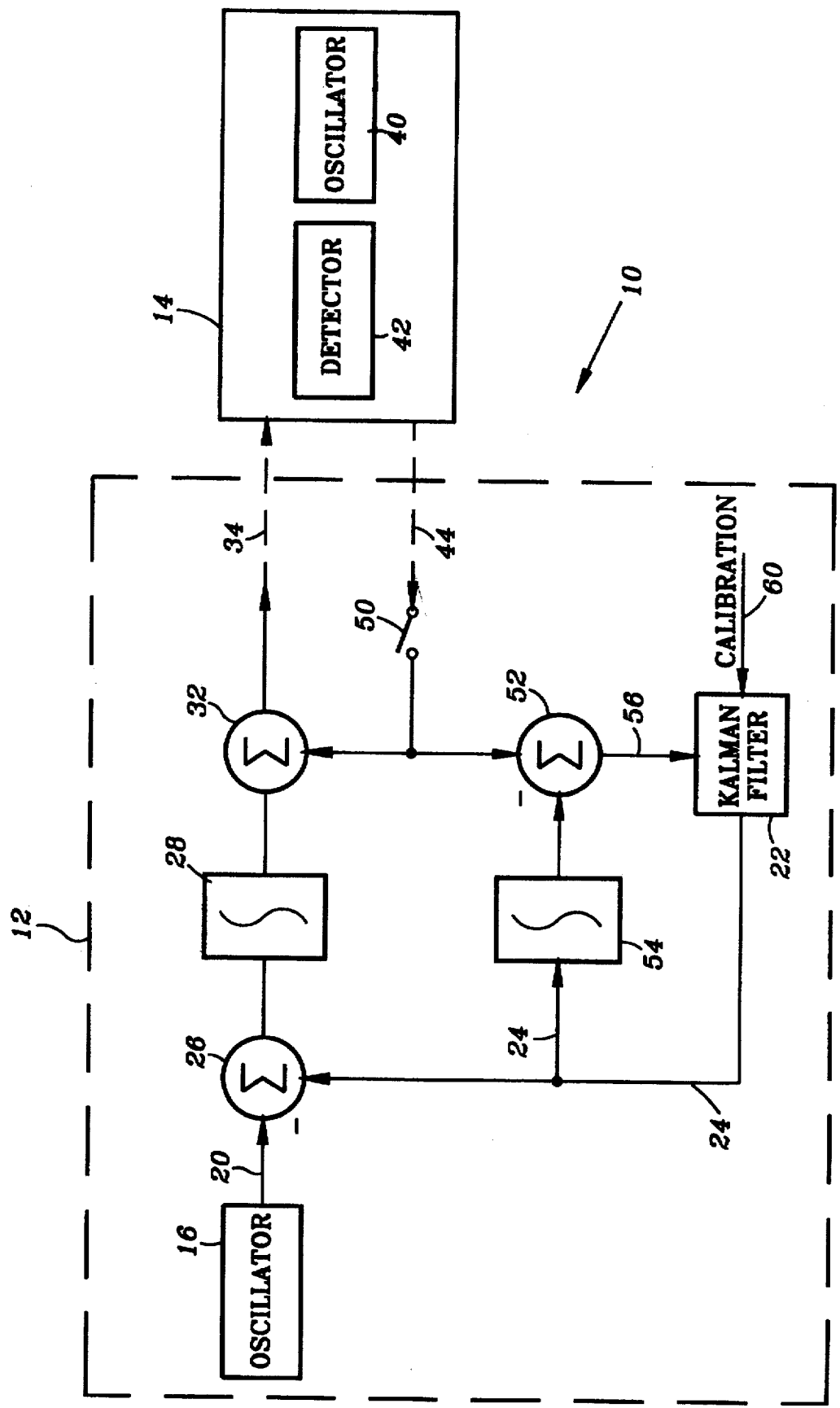

SELF-CALIBRATING FREQUENCY STANDARD SYSTEM

RELATED APPLICATION

This application is a continuation-in-part of U.S. application Ser. No. 08/130,278, filed Oct. 1, 1993, now abandoned and entitled "SELF-CALIBRATED FREQUENCY STANDARD SYSTEM".

TECHNICAL FIELD OF THE INVENTION

The present invention relates to satellite and terrestrial communication systems, and more particularly to a self-calibrating frequency standard for a communication terminal.

BACKGROUND OF THE INVENTION

In several satellite and terrestrial communication systems, user (subscriber) equipment or terminals must acquire and retain time synchronization and frequency synchronization with a central communication node such as the satellite communication payload in satellite communication systems or the cell tower in terrestrial cellular communication systems. The process of acquiring and retaining synchronization with a central communication node, such as satellite or cell tower, imposes strict requirements on the terminal's frequency standard or clock. In some applications, terminals must use high-precision frequency standards to ensure long term stability and accuracy. However, a shortcoming of the use of high-precision frequency standards is the associated expense of such oscillators.

A low cost oscillator such as, for example, a quartz oscillator has numerous shortcomings, including an oscillator's gradual change in frequency over long periods of time. This phenomenon is known as aging. The aging rate of a quartz oscillator is a fundamental limitation in its use in a terminal/central node communication system. Additionally, the performance of quartz oscillators is affected by (1) temperature variation, the range of oscillator frequency as a function of the temperature of the oscillator; (2) retrace, the difference in frequency measured immediately before turn-off and again after turn-on and stabilization; and (3) warm-up, the time measured from initial application of power, required for a crystal oscillator to stabilize its frequency to within specified limits.

A need has thus arisen for a system to provide means for self-calibration of the user terminal frequency standard such as, for example, a quartz oscillator. Such an approach solves the problems heretofore associated with such oscillators due to frequency deviations caused by aging, and the cumulative effect of retrace. Other sources of frequency error, such as warm-up, temperature variation and the magnitude of individual retrace events must be dealt with within the quartz oscillator design.

SUMMARY OF THE INVENTION

In accordance with the present invention, a system for self-calibrating the time/frequency reference of a communication terminal for use with a satellite or other central communication node, the satellite or central communication node provides time based correction signals. The system includes a terminal oscillator which generates an oscillator frequency that includes an error amount. An oscillator calibration filter, implemented as a Kalman filter, generates estimates of the terminal frequency error amount. Circuitry is provided for subtracting the oscillator frequency error estimate amount generated by the oscillator calibration filter from the oscillator frequency that includes an error amount. Circuitry is provided for applying the central communication node or satellite time based correction signals to the oscillator calibration filter to thereby modify the frequency error estimate amount generated by the oscillator calibration filter based upon the satellite or central communication node time base correction signals.

BRIEF DESCRIPTION OF THE DRAWINGS

For a more complete understanding of the present invention and for further advantages thereof, reference is now made to the following Description of the Preferred Embodiments taken in conjunction with the accompanying Drawing which is a block diagram of the present system.

DESCRIPTION OF THE PREFERRED EMBODIMENTS

Referring to the FIGURE, the present system for self-calibrating a frequency standard or clock is illustrated, and is generally identified by the numeral 10. System 10 is implemented in a terminal 12 which communicates with a central communication node, such as, for example, a satellite 14. Terminal 12 includes an oscillator 16, which may comprise, for example, a quartz oscillator. Oscillator 16 generates an output along signal line 20. The output of oscillator 16 is at or near a desired frequency $f_o$. Due to imperfections in the oscillator 16, the output frequency is rarely equal to the exact desired frequency $f_o$. The output frequency can be expressed as the sum of two frequencies, one equal to the desired frequency $f_o$ and the other equal to an error frequency $\Delta f$, which is the difference between the actual frequency produced by the oscillator 16 and the desired frequency $f_o$.

It is important to note that the present invention is used when the terminal is communicating with the satellite, or central communication node. The terminal synchronizes to the downlink time and frequency of a signal sent from the satellite through a process known as downlink time and frequency acquisition. Synchronization to the downlink is maintained through the use of time and frequency tracking loops. Uplink time acquisition is also performed, followed by occasional uplink probes to maintain time tracking. Note that no uplink frequency acquisition is performed, and the burden of frequency accuracy falls on the terminal oscillator.

An important aspect of the present invention is the use of an oscillator calibration filter, such as, for example, a Kalman filter 22. Kalman filter 22 includes a model of the characteristics of terminal oscillator 16 and provides a frequency error estimate amount as an output along signal line 24. The Kalman filter 22 frequency error estimate amount is subtracted from the oscillator frequency (at a frequency equal to the sum of the desired frequency $f_o$ and the unknown error in frequency) at subtractor 26. The Kalman filter 22 frequency error estimate amount predicts and compensates for frequency deviation due to aging of terminal oscillator 16. The frequency error estimate amount is also used to correct the terminal frequency error due to aging as well as to predict the change in frequency of terminal oscillator 16 sometime into the future after terminal 12 has been off and turned back on, thereby eliminating the need for calibration of terminal oscillator 16.

The oscillator calibration filter 22, implemented using Kalman filter techniques, is well known to those skilled in the art and comprises a model which performs state estimation and forecasting for an oscillator or clock characterized by any combination of white phase noise, white frequency noise, random walk frequency noise, random walk frequency aging, and constant frequency aging. Such a calibration filter is built on a model of the system dynamics which has the effect of reducing the deleterious effects of unreasonable data. The Kalman filter provides internal estimates of the variances of each of the state estimates. The Kalman filter 22 includes various algorithms necessary to perform prediction error analysis and to estimate the time, frequency, and frequency aging of terminal oscillator 16 over an initial calibration interval and then forecasts them into the future. The operation of Kalman filters suitable for use in Kalman filter 22 is described in such publications as: "The Application of Kalman Filters and ARIMA Models to the Study of Time Prediction Errors of Clocks for Use in the Defense Communication System (DCS)" by S. R. Stein and J. Evans, 44 Annual Symposium on Frequency Control, 1990, pp. 630–635; "Kalman Filter Analysis of Precision Clocks with Real-Time Parameter Estimation" by S. R. Stein, 43 Annual Symposium on Frequency Control, 1989, pp. 232–236; "Kalman Filter Analysis for Real-Time Applications of Clocks and Oscillators" by S. R. Stein and R. L. Filler, 42 Annual Frequency Control Symposium, 1988, pp. 447–452; all published by IEEE; *Introduction to Random Signals and Applied Kalman Filtering*, Second Edition, by Robert G. Brown and Patrick Y. C. Hwang, John Wylie & Sons, Inc. 1992, pp. 210–241; and U.S. Pat. Nos. 5,144,595 and 5,019,824, all of the above publications being incorporated herein by reference.

The output of subtractor 26 representing the terminal frequency after correction by Kalman filter 22 is applied to an integrator 28 which converts the frequency signal to a time amount. The time amount is corrected utilizing satellite generated time base correction signals at an adder 32. The time corrected signals are used to transmit synchronization probe signals which are transmitted over transmission path 34 to satellite 14. Satellite 14 includes a satellite oscillator 40 and a synchronization probe detector 42. In response to the synchronization probe signals transmitted by the communication terminal 12, satellite 14 generates time based correction signals via the transmission path 44 indicating the error in the time of arrival of the communication terminal 12 synchronization probe relative to the communication central node, satellite 14, time reference. The synchronization probe signals generated by terminal 12 are compared to expected times of arrival based upon oscillator 40 calculated times, and through the use of detector 42, satellite 14 determines the probe time of arrival error. Satellite 14 determines (or calculates) the time-based correction signals by comparing the times at which the synchronization probe signals generated by terminal 12 are detected by detector 42 to the expected times of arrival based upon oscillator 40 calculated times. The time-based correction signal is simply a coded version (the coding occurs to allow the correction signal to be transmitted to the terminal 12) of the amount (or an estimate of the amount) by which the terminal generated synchronization probe signal arrived earlier than or later than its expected time of arrival. This time-based correction signal is transmitted by satellite 14 to terminal 12 and represents the time error that is to be subtracted from the terminal 12 time error estimate amount through switch 50 to adder 52. In this manner, the frequency of oscillator 16 is corrected through the use of the correction signals generated by satellite 14 using the synchronization probe signals generated by terminal 12 and the detector 42 and oscillator 40 in satellite 14.

An important aspect of the present invention is the use of the satellite 14 probe response to provide an input to Kalman filter 22. The result of the processed probe is applied through a subtractor 52 which also receives the output of Kalman filter 22 via an integrator 54. The output of integrator 54 provides a time error estimate amount generated by Kalman filter 22. This time error estimate is added to the negative of the time correction information generated by satellite 14 through subtractor 52 to generate a corrected time error estimate to be provided to Kalman filter 22 via signal line 56. In this manner, Kalman filter 22 is provided with current measured data as a result of probing satellite 14 in order to generate the frequency error estimate to correct the frequency error of oscillator 16.

In the present system 10, Kalman filter 22 therefore not only presents a model of oscillator 16, but also utilizes actual real-time information from satellite 14 in generating frequency error estimates while communication takes place between terminal 12 and satellite 14. Time information provided by satellite 14 is used to correct the frequency of oscillator 16 through the use of the Kalman filter 22. The information in the form of time correction signals provided by satellite 14 therefore not only corrects the time base of terminal 12 via adder 32, but also corrects the frequency of oscillator 16 through the use of the Kalman filter 22. Therefore, the source of frequency changes caused by oscillator 16 is corrected through the use of the present invention.

An additional aspect of the present invention is a further input to Kalman filter 22 through an external calibration input 60. In the event that terminal 12 has been off for a long period of time, manual calibration of terminal oscillator 16 can be made. A determination can be made on start-up of the actual difference in the frequency of oscillator 16 to the frequency of a very accurate frequency standard. The difference in frequency between the accurate frequency standard and terminal oscillator is applied to Kalman filter 22 to provide information for Kalman filter 22 related to the aging process of oscillator 16 for subsequent error correction.

It therefore can be seen that the present system provides for a self-calibrating clock of a communication terminal for use with satellite communication systems in which terminals are connected through a central node. The frequency error of an oscillator is corrected through the use of a Kalman filter which utilizes as an input time error correction signals generated by the satellite in response to synchronization probes. The Kalman filter utilizes this input to predict changes in frequency of the terminal oscillator.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. A system for self-calibrating a communication terminal oscillator for use with a satellite, the satellite generating time base correction signals for the communication terminal oscillator, the communication terminal oscillator generating an oscillator frequency that includes an unknown error amount, the system comprising:

a Kalman filter for generating a frequency error estimate amount;

means for subtracting said frequency error estimate amount from the oscillator frequency;

means for applying the satellite time base correction signals to said Kalman filter to change said frequency error estimate amount generated by said Kalman filter based upon the satellite time base correction signals; and said means for applying the satellite time base correction signals to said Kalman filter includes:

means for converting said Kalman filter frequency error estimate amount to a Kalman filter time error estimate amount; and means for changing said Kalman filter time error estimate amount based on the satellite generated time base correction signals to generate a changed time error input amount to said Kalman filter.

2. A system for self-calibrating a communication terminal oscillator for use with a satellite, the satellite generating time base correction signals for the communication terminal oscillator, the communication terminal oscillator generating an oscillator frequency that includes an unknown error amount, the system comprising:

means for converting the oscillator frequency to a terminal time amount for controlling an up-link signal for transmission from the terminal to the satellite;

means for changing said terminal time amount based on the satellite generated time based correction signals;

a Kalman filter for generating a frequency error estimate amount;

means for subtracting said frequency error estimate amount from the oscillator frequency;

means for applying the satellite time base correction signals to said Kalman filter to change said frequency error estimate amount generated by said Kalman filter based upon the satellite time base correction signals; and said means for applying the satellite time base correction signals to said Kalman filter includes:

means for converting said Kalman filter frequency error estimate amount to a Kalman filter time error estimate amount; and means for changing said Kalman filter time error estimate amount based on the satellite generated time base correction signals to generate a changed time error input amount to said Kalman filter.

3. A system for self-calibrating a communication terminal oscillator for use in communication systems in which a central communication node generates time base correction signals for the terminal oscillator, the terminal oscillator generating an oscillator frequency that includes an unknown error amount, the system comprising:

an oscillator calibration filter for generating a frequency error estimate amount;

means for subtracting said frequency error estimate amount from the oscillator frequency;

means for applying the central communication node time base correction signals to said oscillator calibration filter to change said frequency error estimate amount generated by said oscillator calibration filter based upon the central communication node time base correction signals; and said means for applying the central communication node time base correction signals to said oscillator calibration filter includes:

means for converting said oscillator calibration filter frequency error estimate amount to an oscillator calibration filter time error estimate amount; and means for changing said oscillator calibration filter time error estimate amount based on the central communication node generated time base correction signals to generate a changed time error input amount to said oscillator calibration filter.

4. The system of claim 3 and further including:

means for converting the oscillator frequency to a terminal time based amount for controlling the signal for transmission from the terminal to the central communication node; and means for changing said terminal time based amount based on the central communication node generated time based correction signals.

5. The system of claim 3 wherein said oscillator calibration filter includes a Kalman filter.

* * * * *